Aug. 13, 1968 R. C. GALLAGHER ETAL 3,397,326

BIPOLAR TRANSISTOR WITH FIELD EFFECT BIASING MEANS

Filed March 30, 1965

WITNESSES

Theodore F. Wrobel

James F. Young

INVENTORS
Robert C. Gallagher
& Robert P. Donovan
BY Gordon H Telfer
ATTORNEY

United States Patent Office 3,397,326
Patented Aug. 13, 1968

3,397,326

BIPOLAR TRANSISTOR WITH FIELD EFFECT BIASING MEANS

Robert C. Gallagher, Catonsville, Md., and Robert P. Donovan, Durham, N.C., assignors to Westinghouse Electric Corporation, Pittsburgh, Pa., a corporation of Pennsylvania Filed Mar. 30, 1965, Ser. No. 443,810
5 Claims. (Cl. 307—304)

ABSTRACT OF THE DISCLOSURE

Semiconductor transistor structures wherein an extra region forming a p-n junction with the base region provides control over the current level in the base region by utilizing surface potential control of the junction's reverse characteristic.

This invention relates generally to semiconductor devices and, more particularly, to transistors that have integrally combined therein a field effect biasing means.

Transistors usually have their D.C. operating points set by bias resistors that must be matched to the transistor to achieve the desired operating point. Because of variations between transistors, even those that are made in the same manner, it is difficult to achieve consistently good matching of the transistor and the bias resistors. The problem is even more acute with transistors and resistors fabricated as part of an integrated circuit. What is needed is a more flexible means of establishing the bias level of a transistor, particularly an integrated transistor.

Devices have been disclosed in the literature that are broadly known as field effect devices. One form of field effect device is that wherein a current through a forward biased p-n junction is modulated by control signals applied to the surface of an insulating layer disposed over the junction. It has been proposed that such means of control be used to vary the injection of the emitter junction of a transistor. Various other combinations of transistors and field effect devices have been proposed wherein both the transistor and field effect device retain their separate identity.

It is therefore an object of the present invention to provide an improved semiconductor device for performing bipolar transistor functions having integral field effect biasing means therein.

Another object is to provide improved surface potential controlled transistors whose operating point can be fixed at any desired current level over a wide range and which avoid the necessity of setting the operating point by the selection of a separate resistor.

The above-mentioned and additional objects and advantages are achieved, briefly, through the provision of a semiconductor transistor structure wherein the base region includes, in addition ot the usual regions, an additional region forming a junction with the base region adapted to provide control over the D.C. current level in the base region by utilizing surface potential control of the junction's reverse characteristic. The desired control is preferably achieved by utilizing an impurity concentration gradient in the base region of the transistor that increases away from the surface of the device.

The present invention will be better understood by reference to the following description taken with the accompanying drawing wherein.

Figure 1:
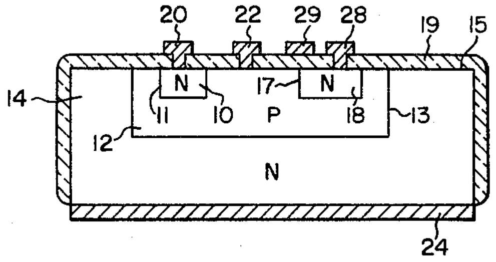
FIGURE 1 is a sectional view of a semiconductor device in accordance with one form of the present invention.

FIG. 1 shows a transistor including emitter, base and collector regions 10, 12 and 14, respectively, disposed in what is commonly referred to as a planar configuration wherein the emitter and collector junctions 11 and 13 terminate at a single planar surface 15. The device differs from the usual planar transistor, however, in that within the base region 12 there is also disposed an additional region 18 of opposite conductivity type forming a p-n junction 17 therein. The structure includes the usual emitter, base and collector contacts 20, 22 and 24. In addition there is a contact 28 to the additional region in the base and a contact 29 disposed on the surface passivating layer 19 that covers the surface 15 over junction 17. The illustrative device of FIG. 1 is of n-p-n type although the semiconductivity type of the various regions may be reversed from that shown.

Figure 2:
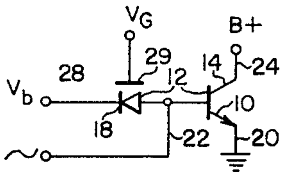
FIG. 2 is a circuit schematic illustrating the utilization of a device such as that of FIG. 1.

In FIG. 2 the structure of FIG. 1 is shown in its equivalent circuit form with reference numerals being the same for equivalent elements. FIG. 2 also shows the manner of operation of the structure. The emitter, base and collector regions 10, 12 and 14 and their respective contacts provide conventional transistor operation. In this example a B+ supply is applied to the collector contact 24, emitter contact 20 is grounded and the signal is applied to base contact 22. In accordance with the present invention the diode formed by the additional n-type region 18 in the base region 12, with the surface potential control electrode 29, constitutes a variable bias resistor the resistance of which is determined by the magnitude of the potential $V_G$ applied to the control electrode 29.

Figure 3:
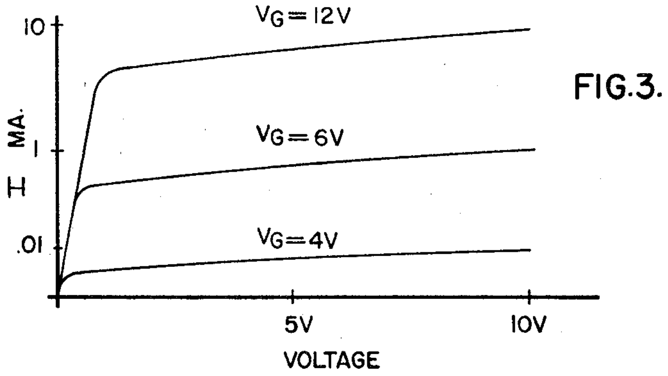
FIG. 3 is a set of curves illustrating the control over D.C. base current achieved in accordance with the present invention.

FIG. 3 shows curves of the reverse current and voltage across the junction 17 formed by the additional n-type region 18 for three magnitudes of control potential. $V_b$ is of a polarity to reverse bias junction 17. In this example it should be positive. For example, contact 28 may be tied to B+. $V_G$ is also positive to induce an n-type channel across the junction 17 whose resistance depends on the magnitude of $V_G$. The current is variable over a considerable range by the amount of potential applied to the control contact 29. Thus considerable flexibility in the adjustment of the base bias is achieved.

It is also possible in accordance with this invention to modify the structure so that a variable bias current is similarly provided in the collector region 14 or, more generally, in any region of a semiconductor device.

Additionally, the structure is amenable to operation with modulation of the forward emitter current by a control electrode that would be disposed over the junction formed by the emitter region.

Not only does the control electrode 29 permit establishment of a desired bias level without the necessity of matching transistors and resistors and without requiring the space for resistors but the operating point can be fixed at the desired current level through the high impedance of the passivating layer that is equivalent to about $10^{15}$ ohms.

In the fabrication of a device such as that shown in FIG. 1, conventional techniques for the formation of planar transistors may be utilized. For example, on an n-type silicon substrate that is to provide the collector region 14 of the device, silicon dioxide masks may be successively formed for the diffusion of the base region 12 in a first diffusion and the n-type regions 10 and 18 in a second diffusion. Also, of course, the structure may be fabricated within an integrated circuit by any of the known techniques.

There is, however, one manner of fabricating devices in accordance with this invention that is considered superior to others available in that it results in a bipolar transistor with a base region having a low surface concentration. As a result of the lower surface concentration the $V_G$ threshold voltage required to form the n-type conductive region is lower in value and far more effective in modulating ability.

This technique is to form the structure on an n-type substrate, for example (that may include relatively high doping to achieve low transistor saturation resistance in accordance with the known techniques) and to grow on the n-type substrate additional n-type material (that may have lower impurity concentration so as to provide a relatively high breakdown voltage for the base-collector junction) wherein the additionally deposited n-type material is formed in two steps. A first layer of n-type epitaxial material is grown after which there is deposited thereon a quantity of acceptor type impurity. Following the deposition of the acceptor type impurity and additional n-type layer is grown during which, or following, the acceptor impurity diffuses to the surface of the n-type epitaxial layer to form the configuration as illustrated. However, the doping concentration of the base region will be graded such that it increases away from the surface of the device contrary to conventional planar technology wherein the surface of the region is most highly doped.

Figure 4:
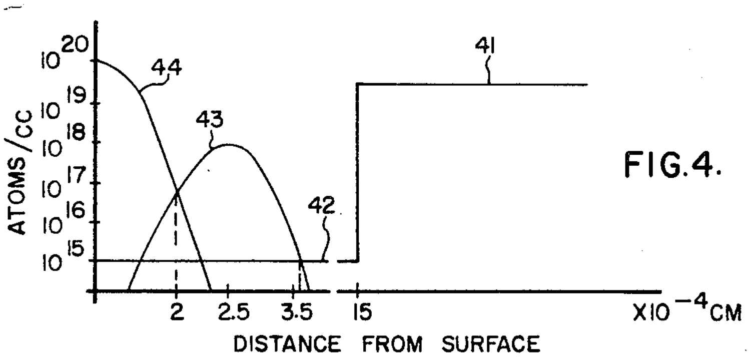
FIG. 4 is a graph of the doping level in the various regions of the device in accordance with the preferred embodiment of the present invention.

FIG. 4 illustrates an example of a desirable impurity concentration profile. The doping level indicated by line 41, approximately $10^{19}$ atoms per cubic centimeter, represents the original highly doped n-type substrate. The line 42 of about $10^{15}$ atoms per cubic centimeter represents the doping in the epitaxially deposited n-type material. The curve 43 represents the doping impurity profile in the p-type base region characterized by a hump produced where the p-type material is deposited between portions of the epitaxially deposited material. The curve 44 represents the doping impurity gradient in the emitter region which is the same as the additional n-type region in the base. The p-n junctions of the device are formed where the curve 43 intersects the curves 44 and 42.

Inherent temperature stabilization may be achieved in devices in accordance with this invention by providing feedback from collector electrode 24 to control electrode 29 so that the base current decreases with temperature. Thus, the increase in current gain of the bipolar transistor that results from an increase in temperature can be offset.

Figure 5:
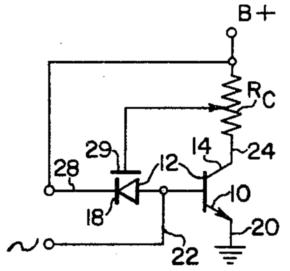
FIG. 5 is a circuit schematic illustrating other features of the present invention.

FIG. 5, similar to FIG. 2, is a circuit schematic modified to show utilization of the temperature stabilization feature. Here, the n-region 18 is tied to B+. The transistor is also supplied by B+ (typically of about 6 volts) with resistor $R_c$ provided to establish the collector current at a desired level. The control electrode 29 is applied to B+ through part of $R_c$. If $R_c$ increases in magnitude with temperature (as occurs where it is provided by a diffused region in an integrated circuit) the effect is to increase the voltage gain of the transistor. However, as $R_c$ increases, the voltage on the control electrode 29 decreases and, with it, the current into the base region. At lower D.C. current levels, the transistor alpha is lower and hence offsets the tendency of $R_c$ to increase voltage gain. Upon a decrease in temperature, the reverse occurs. $R_c$ may, of course, be provided by known integrated circuit techniques within the same body as the transistor structure.

While the present invention has been shown and described in a few forms only, it will be understood that various changes and modifications may be made without departing from the spirit and scope thereof.

What is claimed is:

1. A semiconductor device comprising: first, second and third regions wherein said first and third regions are of opposite semiconductivity type to that of said second region; an additional region of opposite type to said region disposed therein and having a contact thereto with a junction between said additional region and said second region having a control electrode over and insulated from said junction; and each of said first, second, and third regions has an ohmic contact thereon distinct from said contact to said additional region.

2. A semiconductor device in accordance with claim 1 wherein the doping impurity concentration within said second region increases away from the surface thereof.

3. A semiconductor device in accordance with claim 1 further comprising means to apply a D.C. voltage to said ohmic contact to said additional region and to said control electrode to modulate the reverse current across said additional junction.

4. Electronic apparatus comprising a semiconductor device as defined in claim 1 and further comprising: means associated with said ohmic contact to said additional region to reverse bias said p-n junction and means associated with said control electrode to modulate the reverse current across said p-n junction.

5. Electronic apparatus as defined in claim 4 wherein: said means associated with said ohmic contact to said additional region includes a D.C. voltage supply; said third region of said transistor being connected to said D.C. voltage supply through a resistor; said means associated with said control electrode includes a D.C. voltage supply to which said control contact is connected through at least part of said resistor so that variations in the resistance of said resistor do not substantially affect the gain of said transistor.

References Cited

UNITED STATES PATENTS

| | | | |
|---|---|---|---|
| 3,204,160 | 8/1965 | Chih-Tang Sah | 317—235 |
| 3,243,669 | 3/1966 | Chih-Tang Sah | 317—234 |
| 3,244,949 | 4/1966 | Hilbiber | 317—235 |
| 3,271,640 | 9/1966 | Moore | 317—235 |
| 3,274,400 | 9/1966 | Weinstein | 307—88.5 |
| 3,356,858 | 12/1967 | Wanlass | 307—88.5 |

JOHN W. HUCKERT, *Primary Examiner.*

R. F. SANDLERS, *Assistant Examiner.*